(12) United States Patent
Chachad et al.

(10) Patent No.: US 8,661,199 B2
(45) Date of Patent: Feb. 25, 2014

(54) EFFICIENT LEVEL TWO MEMORY BANKING TO IMPROVE PERFORMANCE FOR MULTIPLE SOURCE TRAFFIC AND ENABLE DEEPER PIPELINING OF ACCESSES BY REDUCING BANK STALLS

(75) Inventors: Abhijeet Ashok Chachad, Plano, TX (US); Ramakrishnan Venkatasubramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 13/245,195

(22) Filed: Sep. 26, 2011

(65) Prior Publication Data
US 2012/0191915 A1  Jul. 26, 2012

Related U.S. Application Data

(60) Provisional application No. 61/387,283, filed on Sep. 28, 2010.

(51) Int. Cl.
*G06F 12/08* (2006.01)

(52) U.S. Cl.
USPC ........................................ 711/122

(58) Field of Classification Search
None
See application file for complete search history.

(56) References Cited

U.S. PATENT DOCUMENTS

| | | | | |
|---|---|---|---|---|
| 4,395,754 A | * | 7/1983 | Feissel | 711/207 |
| 6,272,597 B1 | * | 8/2001 | Fu et al. | 711/131 |
| 2002/0042861 A1 | * | 4/2002 | Kavipurapu | 711/118 |
| 2002/0069326 A1 | * | 6/2002 | Richardson et al. | 711/122 |
| 2010/0325366 A1 | * | 12/2010 | Zamsky et al. | 711/142 |

OTHER PUBLICATIONS

TMS320C6000 DSP Cache User's Guide, Texas Instruments, May 2003.*

* cited by examiner

*Primary Examiner* — Matthew Bradley
*Assistant Examiner* — Ramon A Mercado
(74) *Attorney, Agent, or Firm* — Robert D. Marshall, Jr.; W. James Brady; Frederick J. Telecky, Jr.

(57) ABSTRACT

The level two memory of this invention supports coherency data transfers with level one cache and DMA data transfers. The width of DMA transfers is 16 bytes. The width of level one instruction cache transfers is 32 bytes. The width of level one data transfers is 64 bytes. The width of level two allocates is 128 bytes. DMA transfers are interspersed with CPU traffic and have similar requirements of efficient throughput and reduced latency. An additional challenge is that these two data streams (CPU and DMA) require access to the level two memory at the same time. This invention is a banking technique for the level two memory to facilitate efficient data transfers.

2 Claims, 4 Drawing Sheets

(1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

US 8,661,199 B2

EFFICIENT LEVEL TWO MEMORY BANKING TO IMPROVE PERFORMANCE FOR MULTIPLE SOURCE TRAFFIC AND ENABLE DEEPER PIPELINING OF ACCESSES BY REDUCING BANK STALLS

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is caches for digital data processors.

BACKGROUND OF THE INVENTION

This invention is applicable to data processing systems with second level (L2) memory used for both unified (data and instructions) level two cache and flat (L2 SRAM) memory used to hold critical data and instructions. The second level memory (L2) directly addressable SRAM memory is accessible by both external and internal direct memory access (DMA) units.

In the applicable digital data processor all CPU activity is in multiples of cache lines. The level one instruction cache line size is 32 bytes. The level one data cache line size is 64 bytes. The level two cache line size is 128 bytes. The L2 memory controller should be able to handle this traffic efficiently to ensure high throughput and reduced latency for CPU traffic.

SUMMARY OF THE INVENTION

The level two memory of this invention supports coherency data transfers with level one cache and DMA data transfers. The width of DMA transfers is 16 bytes. The width of level one instruction cache transfers is 32 bytes. The width of level one data transfers is 64 bytes. The width of level two allocates is 128 bytes. DMA transfers are interspersed with CPU traffic and have similar requirements of efficient throughput and reduced latency. An additional challenge is that these two data streams (CPU and DMA) require access to the level two memory at the same time. This invention is a banking technique for the level two memory to facilitate efficient data transfers.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
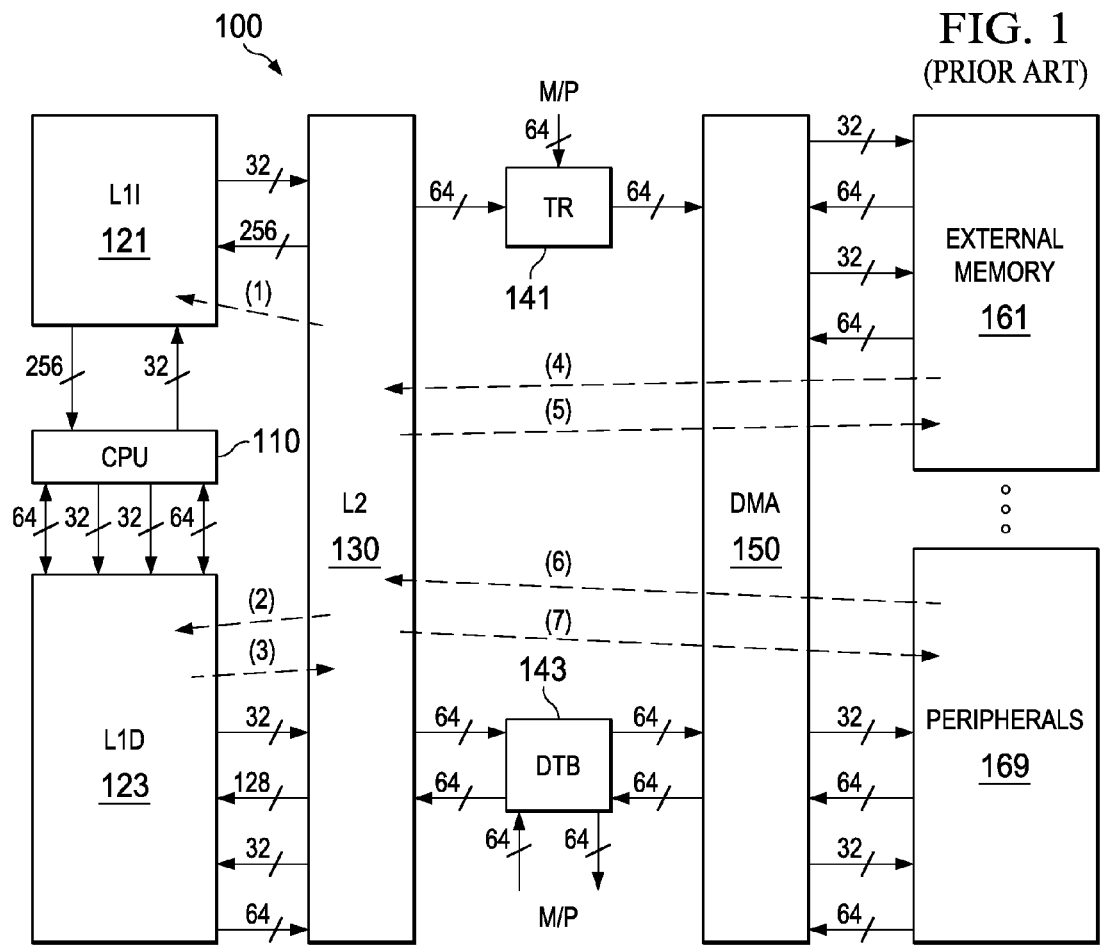
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
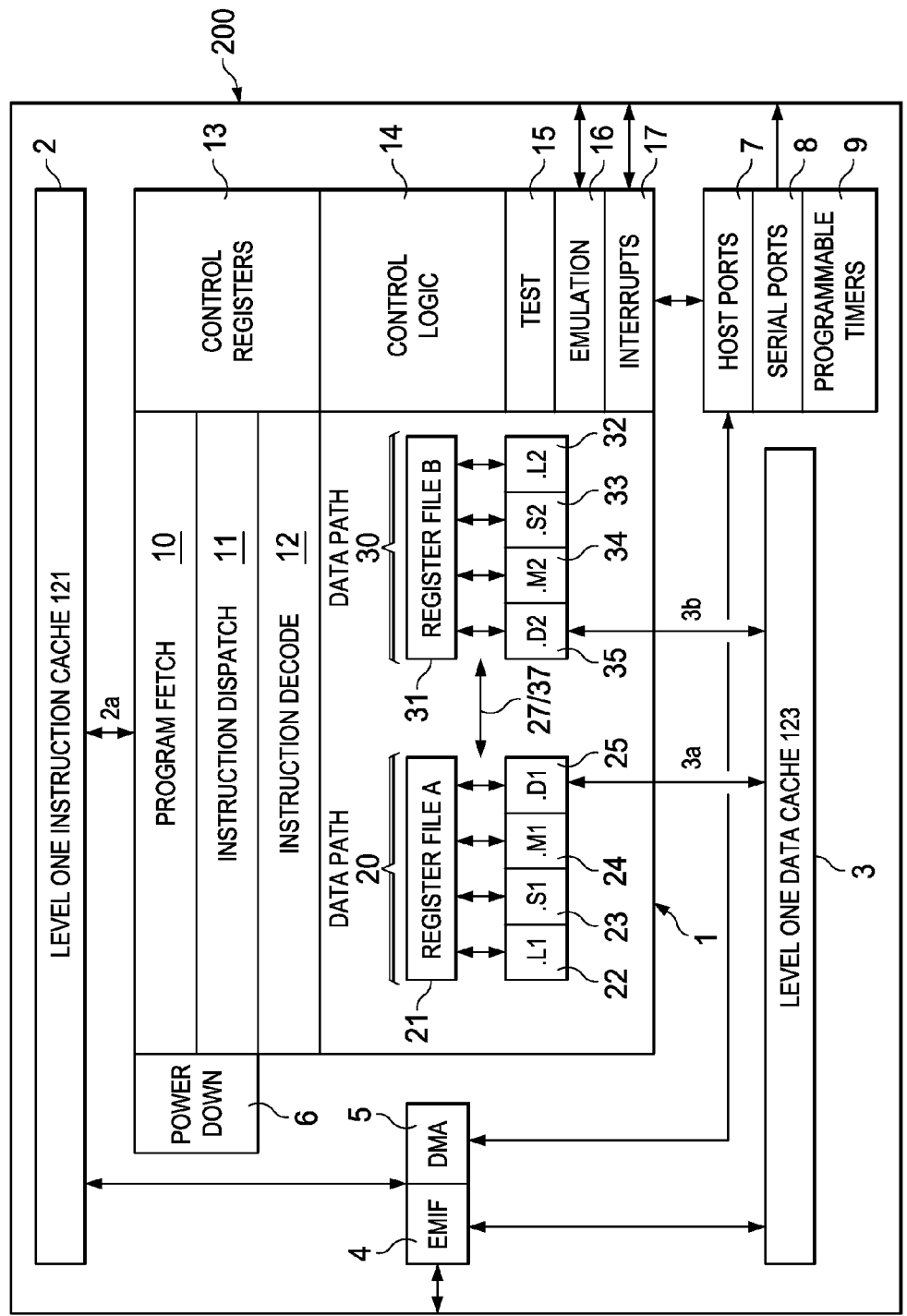
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
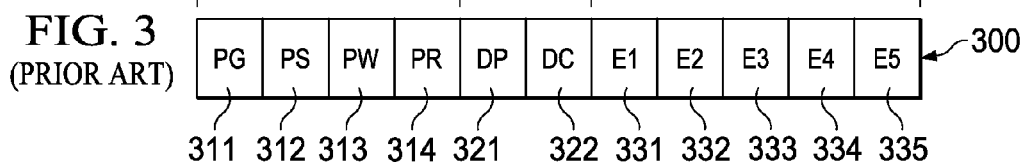
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figures 4, 5:
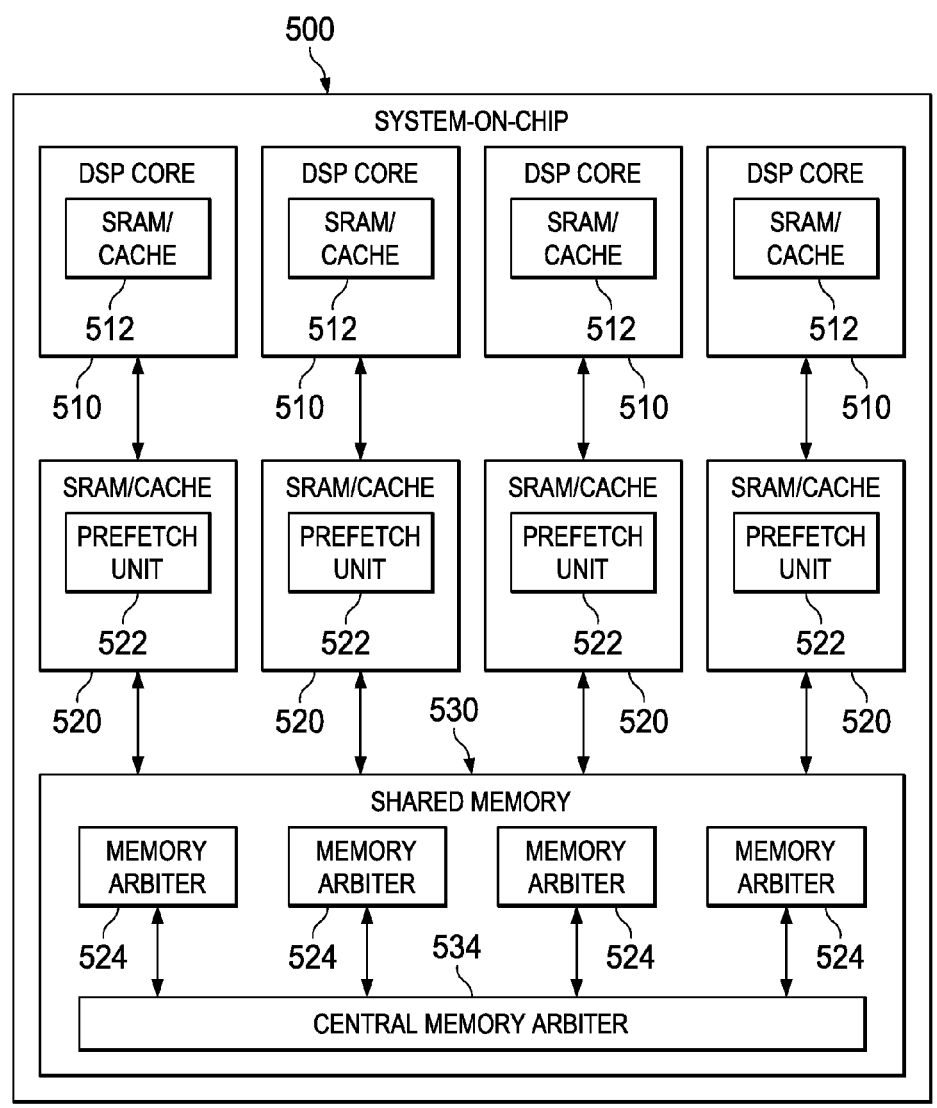
FIG. 4 illustrates the instruction syntax of the very long instruction word digital signal processor core illustrated in FIG. 2 (prior art)
FIG. 5 illustrates a computing system including a local memory arbiter according to an embodiment of the invention.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 is a block diagram illustrating a computing system including a local memory arbiter according to an embodiment of the invention. FIG. 5 illustrates system on a chip (SoC) 500. SoC 500 includes one or more DSP cores 510, SRAM/Caches 520 and shared memory 530. SoC 500 is preferably formed on a common semiconductor substrate. These elements can also be implemented in separate substrates, circuit boards and packages. For example shared memory 530 could be implemented in a separate semiconductor substrate. FIG. 5 illustrates four DSP cores 510, but SoC 500 may include fewer or more DSP cores 510.

Each DSP core 510 preferably includes a level one data cache such as L1 SRAM/cache 512. In the preferred embodiment each L1 SRAM/cache 512 may be configured with selected amounts of memory directly accessible by the corresponding DSP core 510 (SRAM) and data cache. Each DSP core 510 has a corresponding level two combined cache L2 SRAM/cache 520. As with L1 SRAM/cache 512, each L2 SRAM/cache 520 is preferably configurable with selected amounts of directly accessible memory (SRAM) and data cache. Each L2 SRAM/cache 520 includes a prefetch unit 522. Each prefetch unit 522 prefetchs data for the corresponding L2 SRAM/cache 520 based upon anticipating the needs of the corresponding DSP core 510. Each DSP core 510 is further coupled to shared memory 530. Shared memory 530 is usually slower and typically less expensive memory than L2 SRAM/cache 520 or L1 SRAM/cache 510. Shared memory 530 typically stores program and data information shared between the DSP cores 510.

In various embodiments, each DSP core 510 includes a corresponding local memory arbiter 524 for reordering memory commands in accordance with a set of reordering rules. Each local memory arbiter 524 arbitrates and schedules memory requests from differing streams at a local level before sending the memory requests to central memory arbiter 534. A local memory arbiter 524 may arbitrate between more than one DSP core 510. Central memory arbiter 534 controls memory accesses for shared memory 530 that are generated by differing DSP cores 510 that do not share a common local memory arbiter 524.

Figure 6:
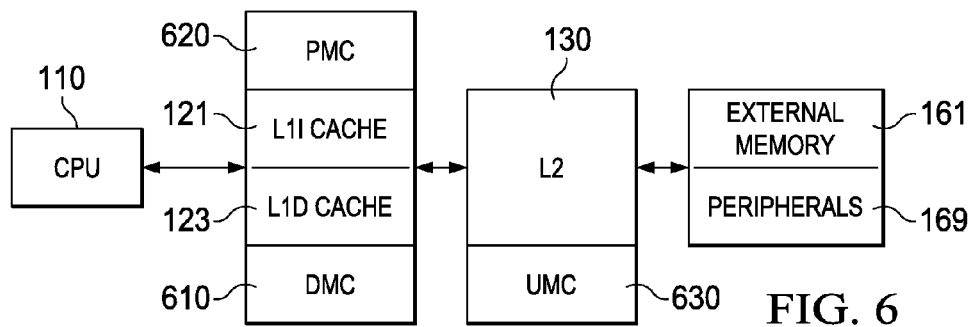
FIG. 6 is a further view of the digital signal processor system of this invention showing various cache controllers.

FIG. 6 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 are controlled by data memory controller (DMC) 610. Data transfers into and out of L1I cache 121 are controlled by program memory controller (PMC) 620. Data transfers into and out of L2 130 including both cache and directly addressable memory (SRAM) are controlled by unified memory controller (UMC) 630. This application is primarily concerned with level 2 cache and UMC 630.

Figure 7:
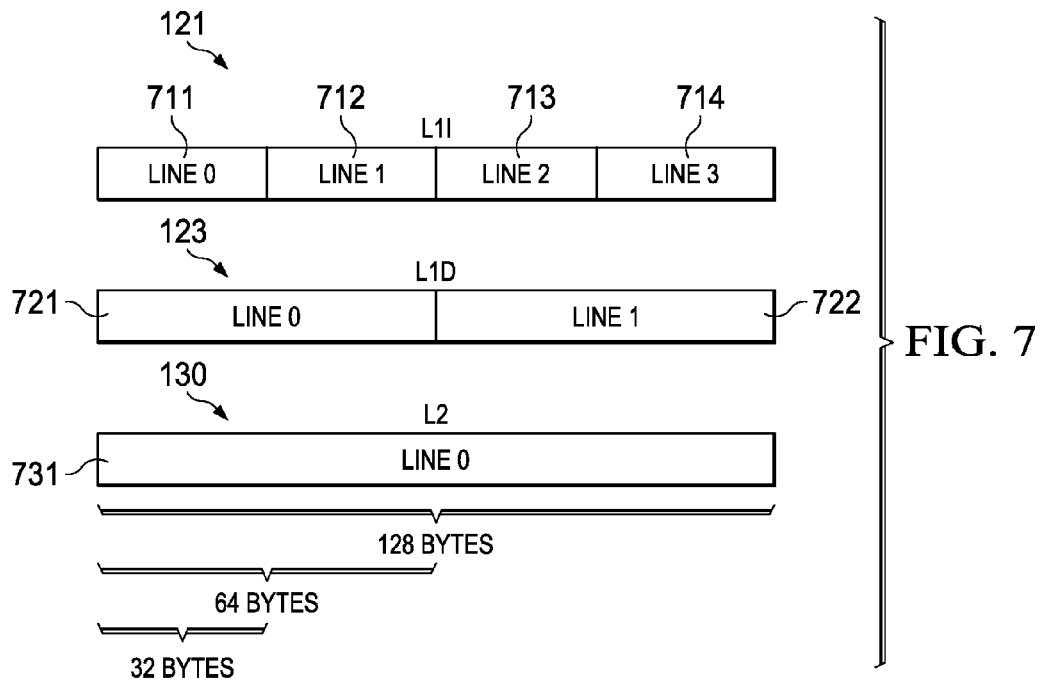
FIG. 7 illustrates the preferred cache line sizes for level one instruction cache, level one data cache and level two cache.

FIG. 7 illustrates the preferred cache line sizes for L1I cache 121, L1D cache 123 and L2 cache 130. In the preferred embodiment of this invention L2 cache line size is 128 bytes, the L1D cache line size is 64 bytes and L1I cache line size is 32 bytes. FIG. 7 illustrates cache lines line 0 711, line 1 712, line 2 713 and line 3 714 of L1I cache 121. Each cache line 711, 712, 712 and 714 includes 32 bytes. These four cache lines total 128 bytes. FIG. 7 illustrates cache lines line 0 721 and line 1 722 of L1D cache 123. Each cache line 721 and 722 includes 64 bytes. These two cache lines total 128 bytes. FIG. 7 illustrates cache line 731 of L2 cache 130. This cache line is 128 bytes.

Figure 8:
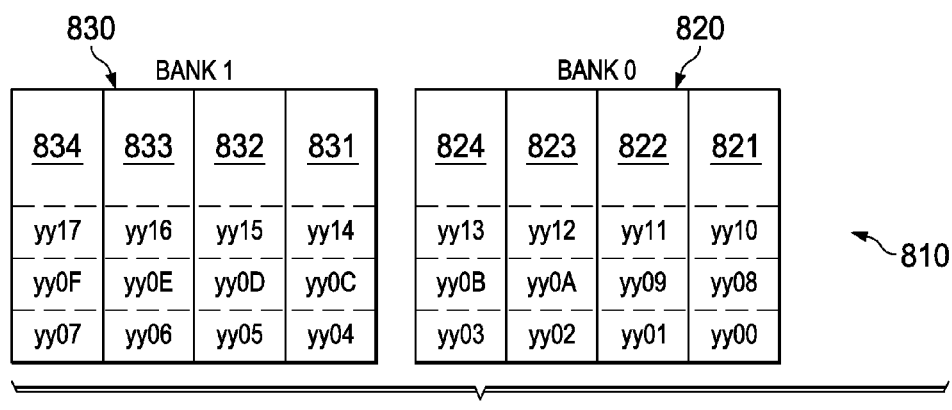
FIG. 8 illustrates the level two cache banking in accordance with this invention.

This invention departs from the banking scheme of previous digital signal processors of the TMS320C6000 family. This invention employs a smaller number of wider banks. FIG. 8 illustrates the banking technique of this invention.

UMC 630 employs two physical memory banks 820 and 830. Each physical bank 820 and 830 includes four virtual banks. Physical bank 0 820 includes virtual banks 821, 822, 823 and 824. Physical bank 1 830 includes virtual banks 831, 832, 833 and 834.

FIG. 8 illustrates the physical storage locations of consecutive data sequences yy00, yy01 . . . to yy17. The first data yy00 is stored in bank 0 820, virtual bank 821; yy01 is stored in bank 0 820, virtual bank 822; yy02 is stored in bank 0 820, virtual bank 823; yy03 is stored in bank 0 820, virtual bank 824; yy04 is stored in bank 1 830, virtual bank 831; yy05 is stored in bank 1 830, virtual bank 832; yy06 is stored in bank 1 830, virtual bank 833; yy07 is stored in bank 1 830, virtual bank 834; yy08 is stored in bank 0 820, virtual bank 821; yy09 is stored in bank 0 820, virtual bank 822; yy0A is stored in bank 0 820, virtual bank 823; yy0B is stored in bank 0 820, virtual bank 824; yy0C is stored in bank 1 830, virtual bank 831; yy0D is stored in bank 1 830, virtual bank 832; yy0E is stored in bank 1 830, virtual bank 833; yy0F is stored in bank 1 830, virtual bank 834; yy10 is stored in bank 0 820, virtual bank 821; yy11 is stored in bank 0 820, virtual bank 822; yy12 is stored in bank 0 820, virtual bank 823; yy13 is stored in bank 0 820, virtual bank 824; yy14 is stored in bank 1 830, virtual bank 831; yy15 is stored in bank 1 830, virtual bank 832; yy16 is stored in bank 1 830, virtual bank 833; and yy17 is stored in bank 1 830, virtual bank 834.

Many of the variables that constrain system performance are specific to the memory. These variables include speed and latency cycles. These variables cannot be changed by controller hardware. This invention banks the memories so that the memory controller enables optimal performance in latency and throughput for all applications.

There are three types of use cases. These are: L1I cache 121 misses; L1D cache 123 misses; and L2 cache 130 allocates and victims. This invention enables pipelined accesses for all these cases without the need to introduce a large number of stalls.

This invention employs multi-level banking. Banking is the relationship between the address and the physical location where the corresponding data is stored. Physical banking separates the memory into sets which are least significant (LS) word banked. Each bank is 16 bytes wide. That enables direct memory access (DMA) transfers which are 16-byte accesses to efficiently access the memory. Each physical bank is then divided into four LS-banked virtual banks which are also 16-bytes wide. This permits CPU 110 access which are typically either 32, 64 or 128 bytes to be reads out be pipelined byte accesses.

CPU traffic is of the three types noted above. A level one instruction miss has a size of 32 bytes. This requires both physical banks 820 and 830. A level one data miss has a size of 64 bytes. This requires both physical banks twice. That is enabled by keeping two halves of the level one data cache line in separate virtual banks. Thus two accesses to the two physical banks can be pipelined because these two accesses are to different virtual banks. Level two allocates and victims have a size of 128 bytes. This requires both physical banks be accessed four times. To achieve maximum pipelining, the level two cache line is spread across both physical banks but kept in eight virtual banks using four virtual banks in each of the two physical banks.

DMA data transfers are 16 bytes wide. These use just one physical bank in one virtual bank. Since the virtual banks are LS-banked with a distance of 16 bytes and typical DMA data transfers are longer bursts, these will trip across the 8 virtual banks. Only one physical bank and one virtual bank is accessed in each cycle enabling 100% pipelining on bursts of DMA data transfers. Table 2 shows the data widths and L2 cache 130 banking for these access types.

TABLE 2

| Access | Data Width | Banks |
|---|---|---|
| DMA | 16 bytes | 1 physical bank, 1 virtual bank |
| L1I miss | 32 bytes | 2 physical banks |
| L1D miss | 64 bytes | 2 physical banks, twice |
| L2 allocate | 128 bytes | 2 physical banks, four times |
| L2 victim | 128 bytes | 2 physical banks, four times |

Prior art solutions have typically focused on getting specially optimized memories with smaller latencies and faster speeds. This increases the complexity in memory design, becomes application dependent, reduces the configurability of the controller and increases power consumption. Some prior art solutions force the controller to support multiple modes depending on the memory being used. Other prior art solutions also require the application to constrain data/instruction storage locations and DMA traffic to get around the memory limitations.

This invention works with any memory as long at it is banked in the way described in the invention. Reduced speed or increased latencies will not have a large effect on the performance of the application. This invention does not require existing applications to be reworked or re-adapted for a change in memory variables.

What is claimed is:

1. A data processing system including:
 a central processing unit;
 a cache memory system connected to said central processing unit including
  a level one instruction cache having a cache line size of N bits;
  a level one data cache having a cache line size of 2N bits, and
  a level two unified cache having a line size of 4N bits disposed in two physical memory banks of 1/2 N bits and 8 virtual memory banks; and
 an external memory storing instructions and data used by said central processing unit;
 said level two unified cache stores level one instruction cache miss data across both physical memory banks, stores level one data cache miss data across both physical memory banks and storing two halves of the level one data cache miss data across two separate virtual memory banks, and stores allocate data from said external memory across both physical memory banks storing allocate data across eight virtual banks using four virtual banks in each of the two physical banks.

2. The data processing system of claim 1, further comprising:
 a direct memory access unit operable to programmably transfer data in increments of 1/2 N bits; and said level two unified cache stores direct memory access data in one physical memory bank.

* * * * *